US009966546B2

(12) United States Patent
Shirahata et al.

(10) Patent No.: US 9,966,546 B2
(45) Date of Patent: May 8, 2018

(54) FLEXIBLE DISPLAY

(71) Applicant: Japan Display Inc., Tokyo (JP)

(72) Inventors: Yuya Shirahata, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days. days.

(21) Appl. No.: 15/417,391

(22) Filed: Jan. 27, 2017

(65) Prior Publication Data
US 2017/0250355 A1 Aug. 31, 2017

(30) Foreign Application Priority Data

Feb. 26, 2016 (JP) ................................. 2016-035289

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3276* (2013.01); *H01L 51/5237* (2013.01); *H01L 2251/5338* (2013.01); *H01L 2251/558* (2013.01); *Y02E 10/549* (2013.01)

(58) Field of Classification Search
CPC ............. H01L 51/0097; H01L 51/5237; H01L 27/3276
See application file for complete search history.

(56) References Cited

U.S. PATENT DOCUMENTS

2006/0038176 A1* 2/2006 Akimoto ........... G02F 1/136227
257/59
2011/0255034 A1 10/2011 Nakano et al.
2014/0021499 A1* 1/2014 Jang .................... H01L 51/0097
257/98

FOREIGN PATENT DOCUMENTS

JP 2011-227205 A 11/2011

* cited by examiner

*Primary Examiner* — Alonzo Chambliss
(74) *Attorney, Agent, or Firm* — Typha IP LLC

(57) ABSTRACT

Provided is a display device having a first region and a second region. The first region includes: a base film; a first layer located over the base film and including a transistor; and a second layer located over the first layer and including a light-emitting element electrically connected to the transistor. The second region includes: the base film; a substrate under the base substrate; and a wiring layer located over the base film and including a wiring extending from the first layer to an edge portion of the base film. A thickness of the substrate decreases with decreasing distance to the first region.

20 Claims, 13 Drawing Sheets

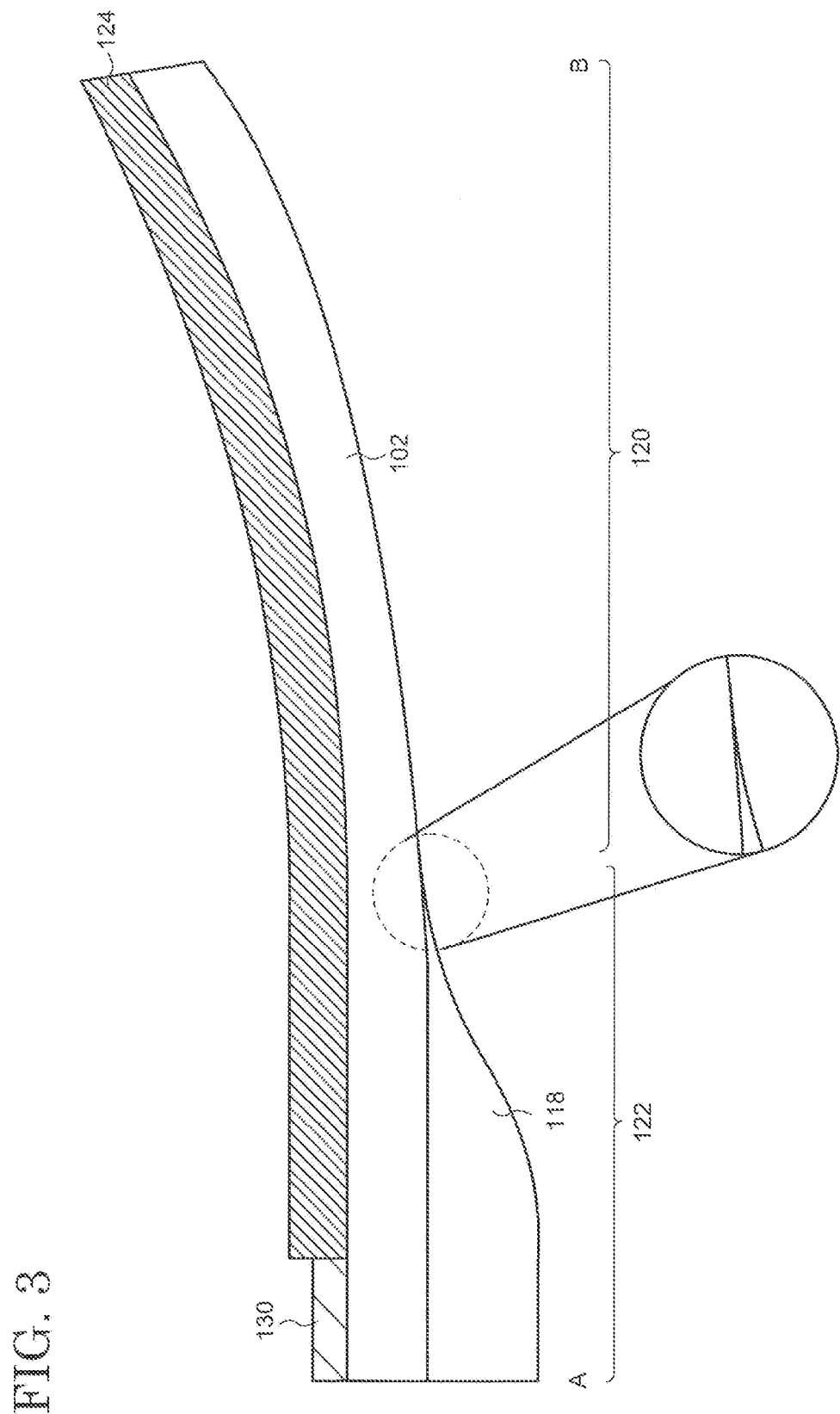

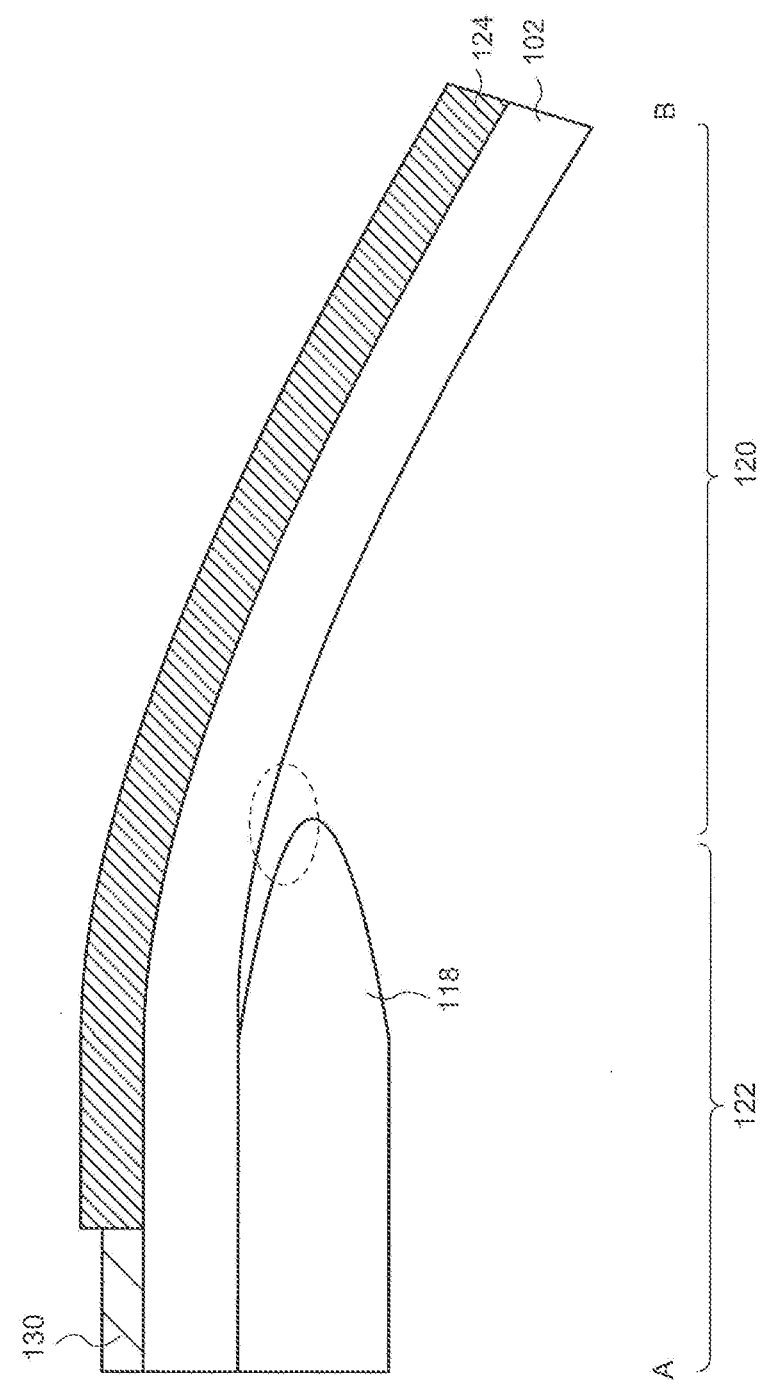

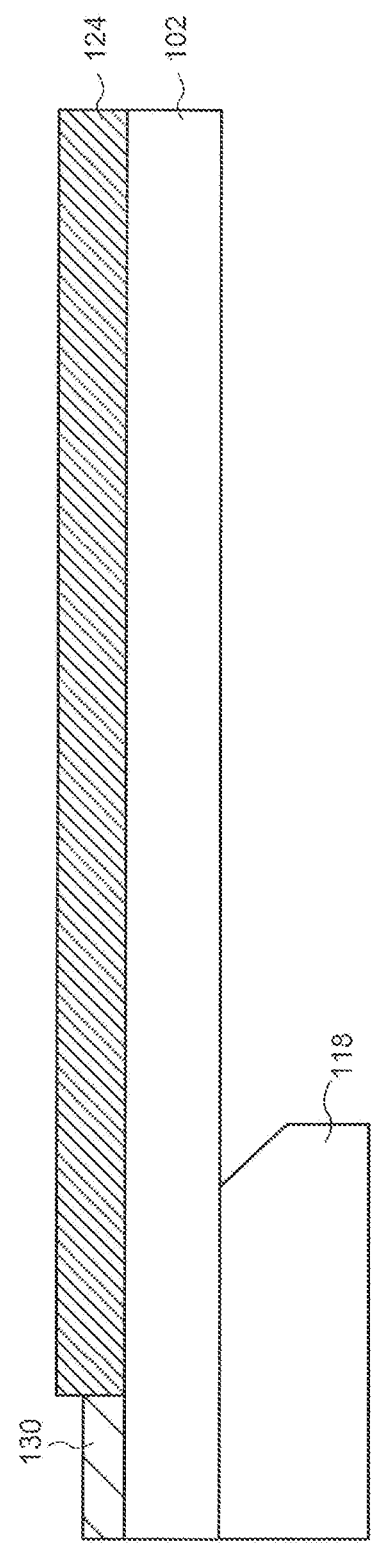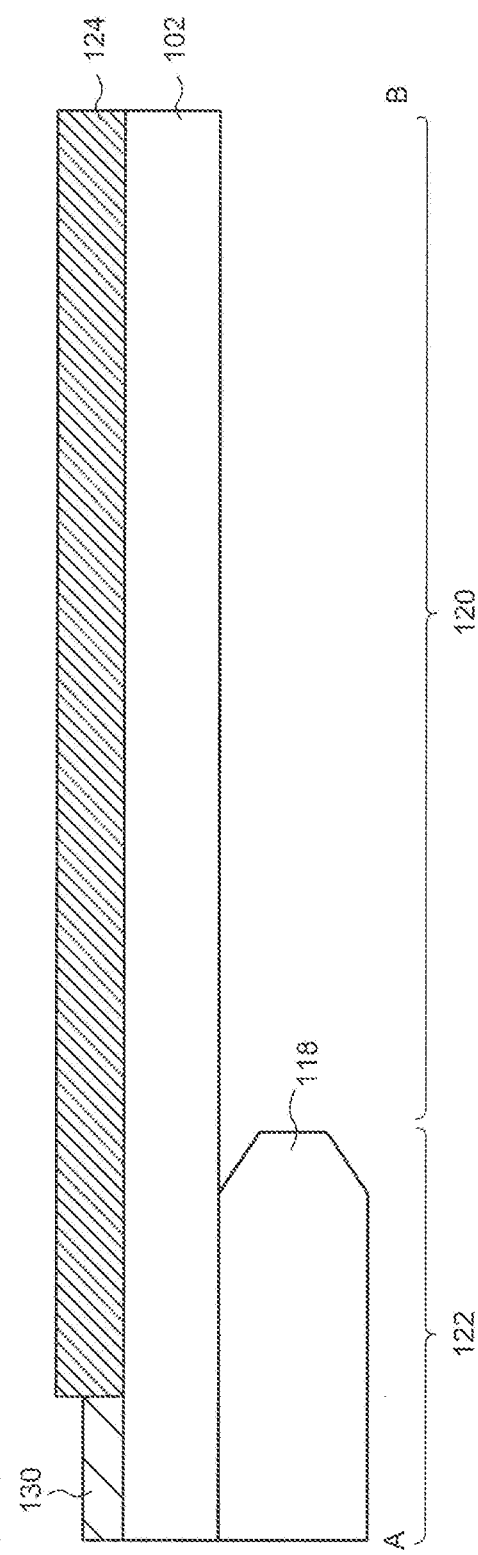

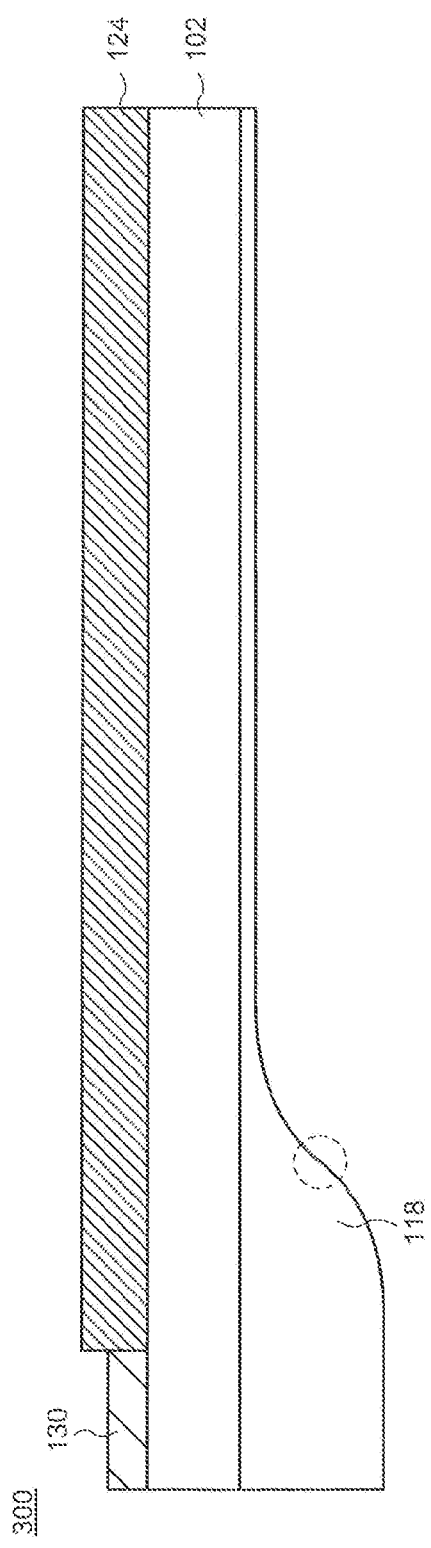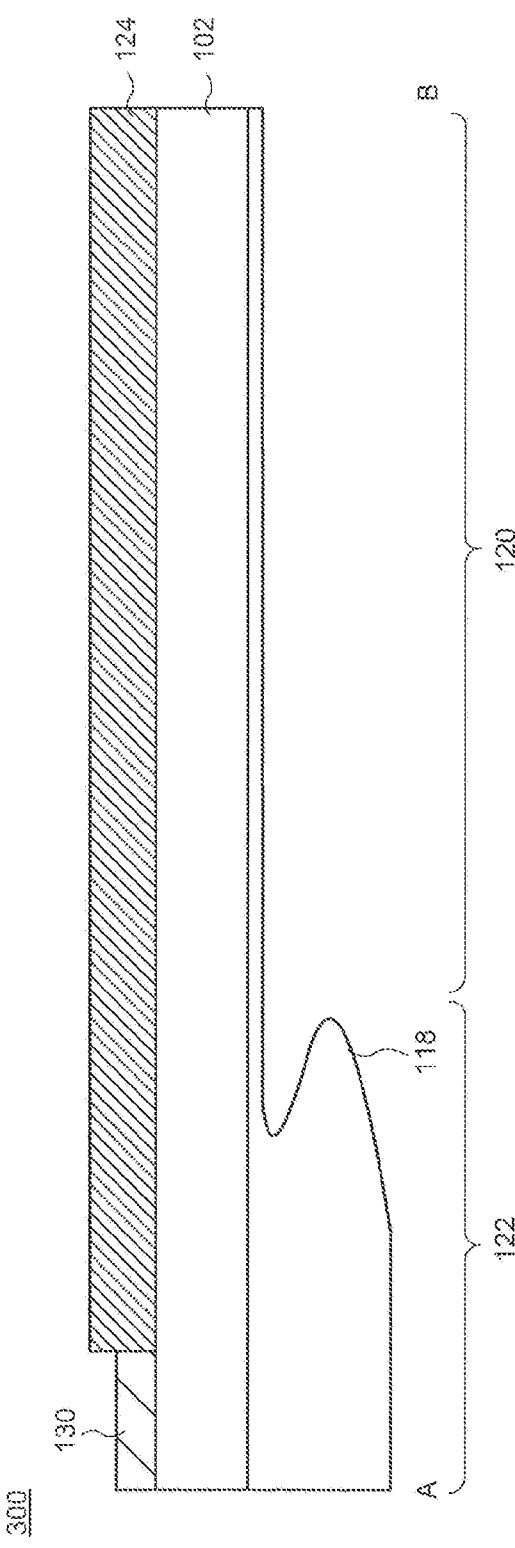

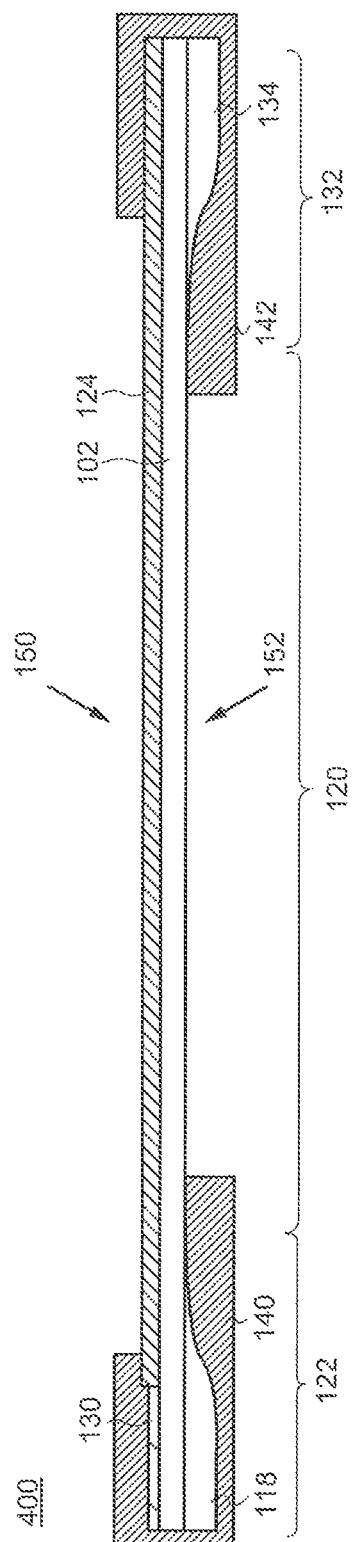
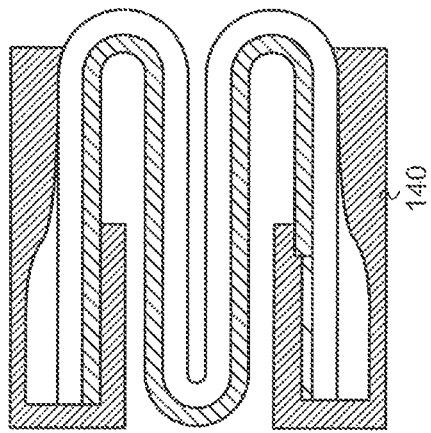
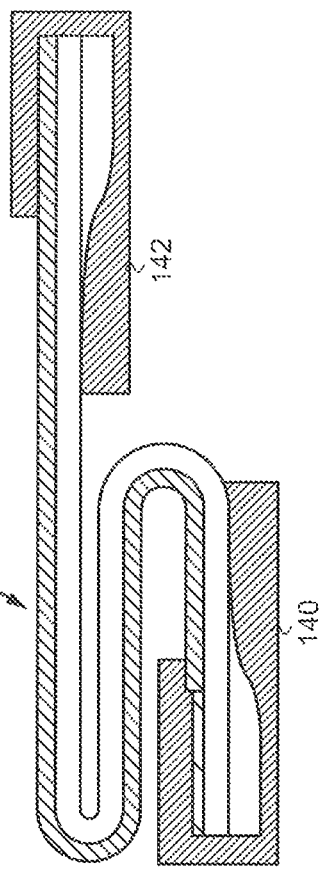

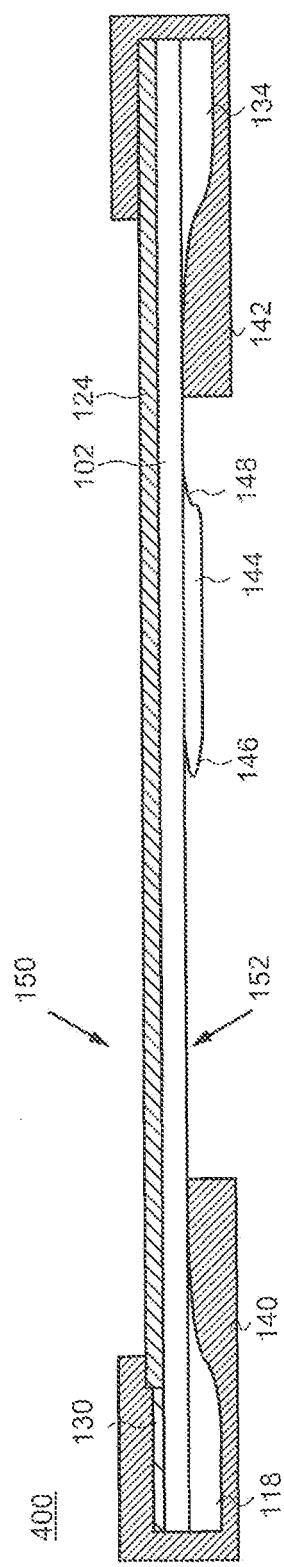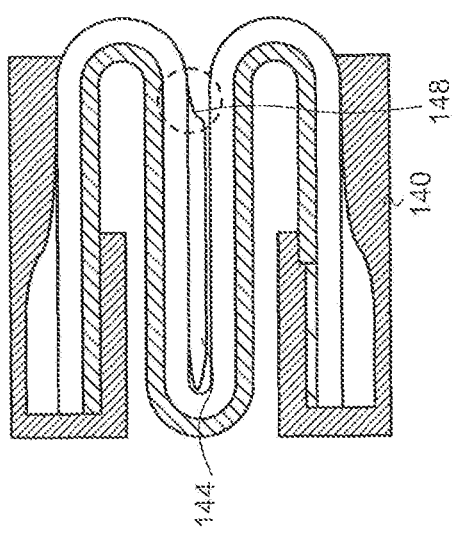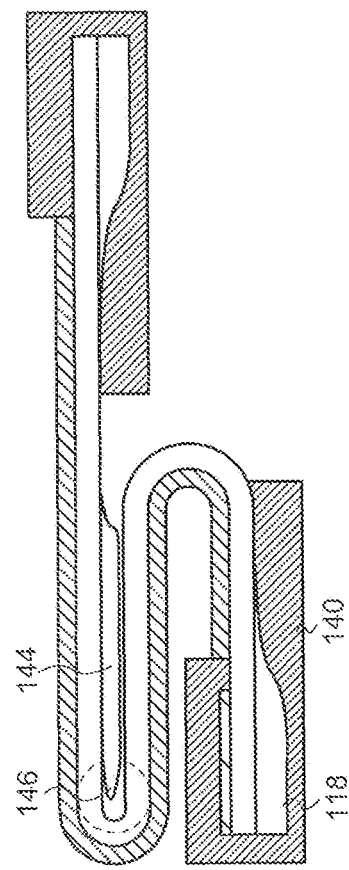

FLEXIBLE DISPLAY

CROSS REFERENCE TO RELATED APPLICATIONS

This application is based on and claims the benefit of priority from the prior Japanese Patent Application No. 2016-035289, filed on Feb. 26, 2016, the entire contents of which are incorporated herein by reference.

FIELD

The present invention relates to a display device exemplified by a flexible EL display device.

BACKGROUND

As a typical example of a display device, a liquid display device and an organic EL (electroluminescence) display device having a liquid crystal element or a light-emitting element in each pixel are represented. These display devices have a display element such as a liquid crystal element and an organic light-emitting element (hereinafter, referred to as a light-emitting element) in each of a plurality of pixels formed over a substrate. A liquid crystal element and a light-emitting element possess a liquid crystal or a layer (hereinafter, referred to as an organic layer) including an organic compound between a pair of electrodes and are driven by applying a voltage or supplying a current between the pair of electrodes.

Since a light-emitting element is an all-solid display element, display quality is not influenced in principle even if a display device provided with flexibility is folded or bent. This feature has been utilized to fabricate the so-called flexible display (sheet display) in which a light-emitting element is formed over a flexible substrate. For example, a flexible organic EL display device which is foldable is disclosed in Japanese patent application publication No. 2011-227205.

SUMMARY

An embodiment of the present invention is a display device having a first region and a second region. The first region includes: a base film; a first layer located over the base film and including a transistor; and a second layer located over the first layer and including a light-emitting element electrically connected to the transistor. The second region includes: the base film; a substrate under the base film; and a wiring layer located over the base film and including a wiring extending from the first layer to an edge portion of the base film. A thickness of the substrate decreases with decreasing distance to the first region.

An embodiment of the present invention is a display device having a first region and a second region. The first region includes: a base film; a first layer located over the base film and including a transistor; and a second layer located over the first layer and including a light-emitting element electrically connected to the transistor. The second region includes: the base film; a wiring layer located over the base film and including a wiring extending from the first layer to an edge portion of the base film; and a substrate under the base film. A thickness of the substrate is constant in the first region, and a thickness of the substrate decreases with decreasing distance to the first region in the second region. The substrate continues from the first region to the second region.

BRIEF DESCRIPTION OF DRAWINGS

FIG. 3 is a schematic cross-sectional view of a display device according to an embodiment;

FIG. 5 is a schematic cross-sectional view of a display device according to an embodiment;

FIG. 6A and FIG. 6B are each a schematic cross-sectional view of a display device according to an embodiment;

FIG. 8A and FIG. 8B are each a schematic cross-sectional view of a display device according to an embodiment;

FIG. 11A to FIG. 11C are each a schematic cross-sectional view of a display device according to an embodiment;

FIG. 12A to FIG. 12C are each a schematic cross-sectional view of a display device according to an embodiment.

DESCRIPTION OF EMBODIMENTS

Hereinafter, the embodiments of the present invention are explained with reference to the drawings. However, the invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film which is formed as the same layer in the same process. Therefore, the plurality of films is defined as films existing in the same layer.

First Embodiment

In the present embodiment, a display device according to an embodiment of the present invention is explained by using FIG. 1 to FIG. 6B.

Figure 1:
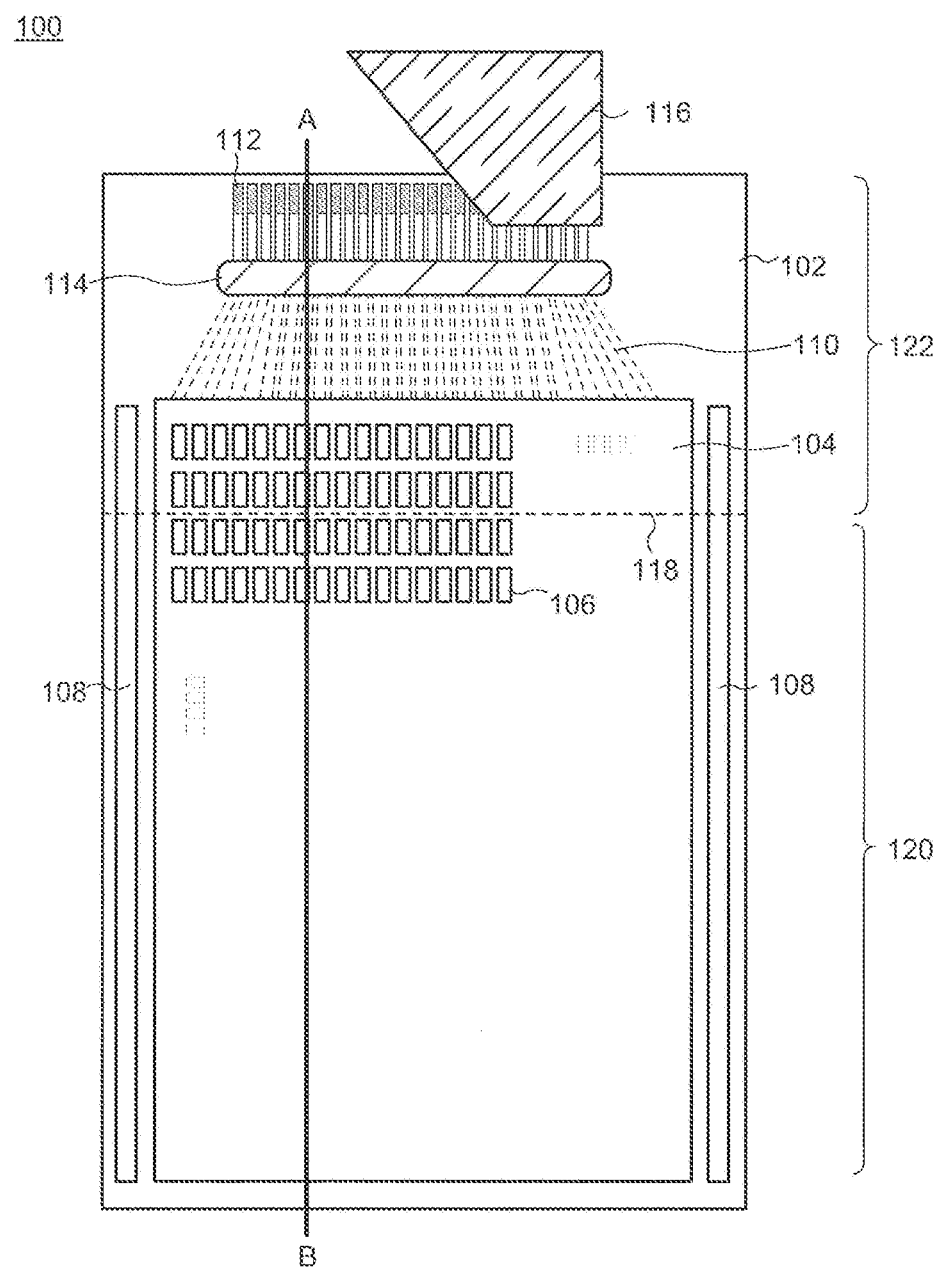
FIG. 1 is a schematic top view of a display device according to an embodiment.

A top view of the display device 100 according to the present embodiment is shown in FIG. 1. The display device 100 has a display region 104 including a plurality of pixels 106 and gate-side driver circuits (hereinafter, referred to as driver circuits) 108 over one surface (top surface) of a base film 102. The base film 102 is also called a base substrate. The pixels 106 are arranged in a matrix form and each provided with a light-emitting element. A wiring 110 extends from the display region 104 to a side surface (in the drawing, a short side of the display device 100) of the base film 102 and is exposed at an edge portion of the base film 102 to form terminals 112. The terminals 112 are connected to a connector 116 such as a flexible printed circuit (FPC) by which the connector 116 and the display region 104 are electrically connected through the wiring 110. In the present embodiment, two driver circuits 108 are disposed so as to sandwich the displayer region 104. However, the number of the driver circuits 108 may be one. Furthermore, the driver circuits 108 may not be arranged over the base film 102, and a driver circuit provided over another substrate may be formed over the connector 116, for example. Note that, in order to promote understanding, a part of the connector 116 is not illustrated in FIG. 1.

The display region 104 is also electrically connected to an IC chip 114 through the wiring 110. Image signals supplied from an external circuit (not shown) are given to the pixels 106 through the driver circuits 108 and the IC chip 114 by which light emission of the pixels 106 is controlled and an image is reproduced on the display region 104. Note that, although not illustrated, the display device 100 may have, for example, a source-side driver circuit at a periphery of the display region 104 instead of the IC chip 114.

The use of the flexible base film 102 provides flexibility to the whole of the display device 100, by which display device 100 can be folded or bent so as to be deformed. The base film 102 can include a polymer material such as a polyimide, a polyester, a polyamide, and an acrylic resin, for example. It is preferable to use a polymer material such as a polyimide and a polyamide, which is highly resistant to the process for forming the layers (described below) formed over the base film 102.

Full color display can be realized, for example, by providing a red-, green-, or blue-emissive light-emitting element to each pixel 106. Alternatively, a white-emissive light-emitting element may be used in all pixels 106, and full color display may be performed by extracting a red, green, or blue color from every pixel 106 in association with a color filter. The colors finally extracted are not limited to a combination of red, green, and blue color. For example, red, green, blue, and white colors can be extracted from the pixels 106. The arrangement of the pixels 106 is also not limited, and a stripe arrangement, a delta arrangement, a mosaic arrangement, and the like can be employed.

Figure 2A:
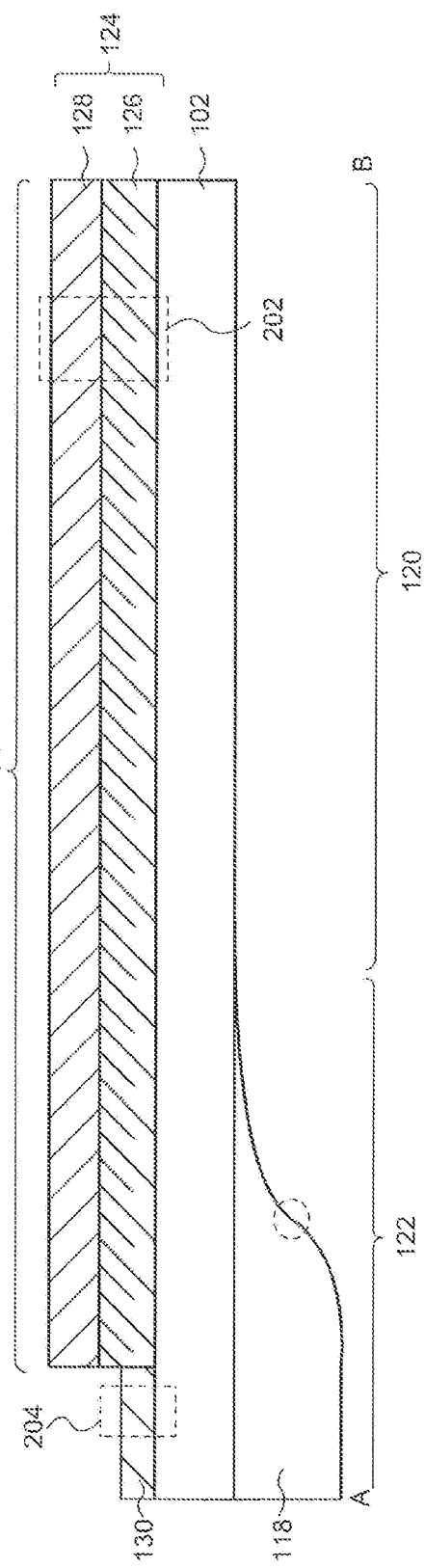
FIG. 2A to FIG. 2C are each a schematic cross-sectional view of a display device according to an embodiment.

A substrate (first substrate) 118 is disposed on a bottom surface of the base film 102, that is, on an opposite surface with respect to a surface over which the display region 104 and the driver circuits 108 are formed. A schematic cross-sectional view along straight line A-B of FIG. 1 is shown in FIG. 2A. Referring to FIG. 2A, a layer (wiring layer) 130 including the wiring 110 and the terminals 112 is arranged on the top surface of the base film 102. Similarly, a layer (element layer) 124 forming the display region 104 is formed over the top surface of the base film 102. The element layer 124 has a first layer (transistor layer) 126 including a transistor 210 which controls driving of the light-emitting element 250 and a second layer (EL element layer) 128 formed over the transistor layer 126 and including the light-emitting element 250.

Figure 2C:
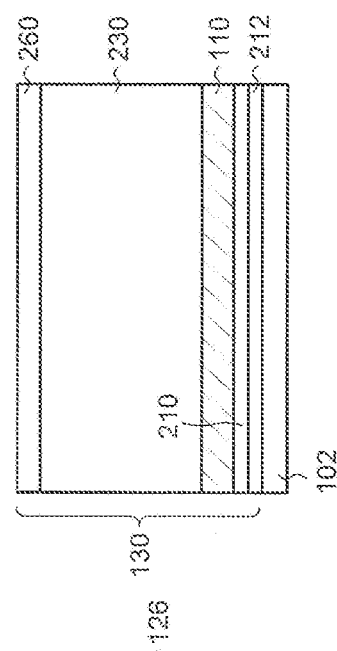
Figure 2B:
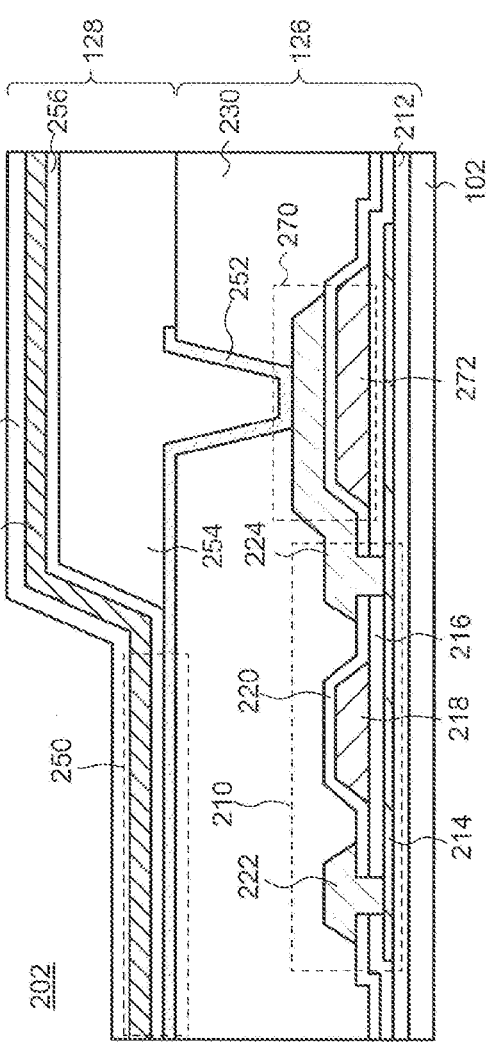

FIG. 2B shows a region 202 of FIG. 2A in more detail. As shown in FIG. 2B, the transistor 210 is included in the transistor layer 126. Other than the transistor 210, a capacitor 270 may be included in the transistor layer 126, for example. Furthermore, although not shown, a plurality of transistors and capacitors may be arranged in one pixel 106.

The transistor 210 has the transistor 210 over the base film 102, and a semiconductor film 214 over an undercoat 212, a gate insulating film 216, a gate 218, an interlayer film 220, a source 222, a drain 224, and the like are included in the transistor 210, for example. The capacitor 270 may be structured by an electrode 272 existing in the same layer as the gate 218, the interlayer film 220, and a part of the drain 224. Moreover, a leveling film 230 is provided over the transistor 210 and the capacitor 270. Note that, although the transistor layer 126 is illustrated in FIG. 2B so as to include the undercoat 212, the leveling film 230, and each of the layers formed therebetween, it is possible to recognize that the undercoat 212 and the leveling film 230 are not included in the transistor layer 126. The transistor layer 126 may include at least one transistor 210 which controls the light-emitting element 250.

The EL element layer 128 includes: an electrode (first electrode) 252 which is electrically connected to the drain 224 of the transistor 210 in an opening portion formed in the leveling film 230; a partition wall 254 covering an edge portion of the first electrode 252 and the opening portion; an organic layer 256 disposed over the electrode 252 and the partition wall 254; an electrode (second electrode) 258 over the organic layer 256; and a passivation film 260 arranged over the electrode 258. The light-emitting element 250 is structured by the electrodes 252 and 258 and the organic layer 256 sandwiched therebetween. Note that, although the EL element layer 128 is illustrated in FIG. 2B so as to include the electrode 252, the passivation film 260, and the layers interposed therebetween, it can be recognized that the passivation film 260 is not included in the EL element layer 128 and that the leveling film 230 is included in the EL element layer 128, for example. Additionally, as an optional structure, a color filter, a light-shielding film, an opposing substrate, and the like may be provided over the passivation film 260, for example. Note that, although each of the layers shown in FIG. 2B is illustrated so as to have a single-layer structure, these layers may be structured with a plurality of layers.

A more detailed structure of a partial region 204 of the wiring layer 130 shown in FIG. 2A is shown in FIG. 2C. As shown in FIG. 2C, the wiring layer 130 has the undercoat 212 over the base film 102, the gate insulating film 216, the wiring 110 existing in the same layer as the source 222 and the drain 224, the leveling film 230, the passivation film 260, and the like. The structure shown in FIG. 2C is an example, and the gate insulating film 216, the leveling film 230, the passivation film 260, or the like may not be provided in the wiring layer 130, for example. The wiring layer 130 may include the wiring 110, and it is possible to recognize that the wiring layer 130 has a structure in which the layers except for the wiring 110 are not included in the wiring layer 130. Furthermore, although the wiring 110 is illustrated so as to exist in the same layer as the source 222 and the drain 224 in the present embodiment, the wring 110 may exist in the same layer as the gate 218 or another metal layer. Note that, although each of the layers shown in FIG. 2C is illustrated so as to have a single-layer structure, these layers may be structured with a plurality of layers.

As shown in FIG. 2A, the substrate 118 is disposed so as to overlap with a part of the base film 102. Another part of the base film 102 is not in contact with the substrate 118 and is exposed from the substrate 118. This region is a first region 120. On the other hand, a region in which the base film 102 and the substrate 118 are in contact with each other is a second region 122. In the present embodiment, the substrate 118 is provided so as to overlap with the wiring layer 130. As shown in FIG. 2A, a part of the base film 102 may overlap with the element layer 124. That is, the transistor layer 126 and the EL element layer 128 may overlap with the second layer 122. On the contrary, the substrate 118 may be formed so as not to overlap with the element layer 124.

Here, as shown in FIG. 2A, a thickness of the substrate 118 decreases with decreasing distance to the first region 120. That is, the substrate 118 has a taper shape. An edge portion of the taper shape is in contact with the base film 102. A surface of the substrate 118 may be curved and may have an inflection point. For example, a side surface of the substrate 118 shown in FIG. 2A has one infection point (a portion surrounded by a dotted circle).

For the substrate 118, an inorganic material such as glass, quartz, a metal or an organic material such as a polyester, a polyimide, a polyamide, an acrylic resin, or a polycarbonate can be used, for example. The substrate 118 is preferably less flexible and is harder than the base film 102.

Generally, when a flexible display device is fabricated, the base film 102 is formed substantially over the whole surface of a large supporting substrate which has low flexibility and which possesses chemical resistance and physical strength to the fabrication process of the element layer 124, and then a plurality of display devices is formed thereover. As the supporting substrate, a glass substrate or a quartz substrate is usually used. After that, the supporting substrate is peeled off, by which a plurality of flexible display devices is obtained over the base film 102. After that, the base film 102 is divided to isolate each display device, and then the individual display device is connected to the connector 116 and the IC chip 114. An anisotropic conductive film is used for the connection with the connector 116 and the IC chip 114. An electrical connection is attainable by sandwiching an anisotropic conductive film between terminals of a display device and the connector (for example, the terminals 112 and the connector 116 in FIG. 1), followed by crimping the terminals and the connector. Since the base film 102 over which the plurality of display devices is formed has flexibility after peeling the supporting substrate, its handling is not always easy. Moreover, the mounting process of the connector 116 and the IC chip 114 after isolating the individual display device is significantly difficult. One of the reasons is that it is difficult to subject the flexible display device to the aforementioned crimping procedure while stably fixing a flexible display device at a predetermined position.

On the other hand, as shown in FIG. 2A, formation of the nonflexible substrate 118 in the second region 122 overlapping with the wiring layer 130 over which the connector 116 and the IC chip 114 are mounted allows the region over which the connector 116 and the IC chip 114 are mounted to be provided with sufficiently high strength, while maintaining the flexibility in most part of the display device 100. Therefore, the connector 116 and the IC chip 114 can be readily connected to the wiring 110 included in the wiring layer 130.

Moreover, when the display device 100 is deformed as shown in FIG. 3, that is, when the first region 120 including the display region 104 is bent so that the EL element layer 128 is located more inside than the transistor layer 126, the edge portion of the substrate 118 is bent along the bent portion due to its small thickness, which allows the contact with the base film 102 to be maintained (see the expanded drawing of FIG. 3). Hence, it is possible to prevent the base film 102 from being peeled from the substrate 118. Accordingly, not only can a manufacturing yield of a display device be increased, but also resistance to physical stress can be enhanced, by which reliability of a display device can be improved.

Figure 4:
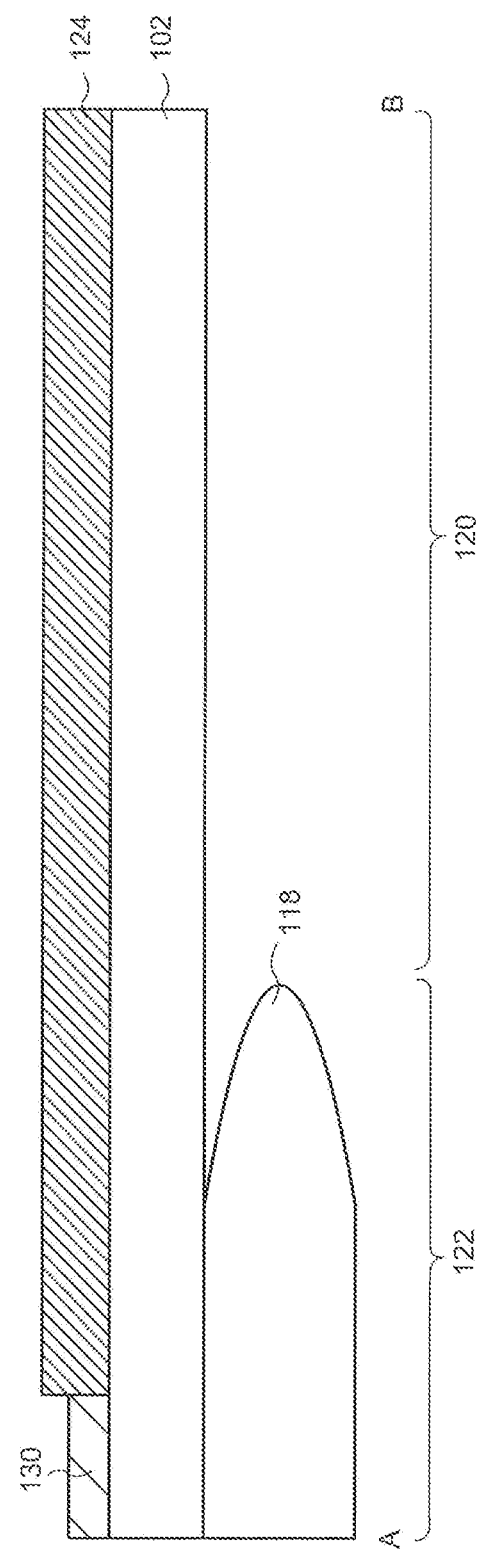
FIG. 4 is a schematic cross-sectional view of a display device according to an embodiment.

In the present embodiment the shape of the substrate 118 is not limited to the aforementioned structure. For example, as shown in FIG. 4, the substrate 118 may have a taper shape with a round edge portion. In this case, an edge portion of the taper shape is not in contact with the base film 102 and is spaced therefrom.

When the display device 100 provided with the substrate 118 having such a shape is bent as shown in FIG. 5, that is, when the first region 120 including the display region 104 is bent so that the transistor layer 126 is located more inside than the EL element layer 128, it is possible to prevent the display 100 from being damaged even if the base film 102 contacts with the edge portion of the substrate 118 (see the region surrounded by an ellipse in the drawing) because the edge portion of the substrate 118 has a round shape. Hence, not only can the connection of the connector 116 and the IC chip 114 be facilitated and a manufacturing yield of a display device increased, but also resistance to physical stress can be enhanced, by which reliability of a display device can be improved.

Additionally, the edge portion of the base substrate 118 may have a taper shape, and the taper shape may have a plane perpendicular to the surface of the base film 102 as shown in FIG. 6A and FIG. 6B. In this case, it is also possible to prevent the base film 102 from being damaged even if the display device 100 is bent and the edge portion contacts with the base film 102. As a result, the display device 100 can be prevented from being damaged. Accordingly, not only can the connection of the connector 116 and the IC chip 114 be facilitated and a manufacturing yield of a display device increased, but also resistance to physical stress can be enhanced, by which reliability of a display device can be improved.

Second Embodiment

Figure 7:
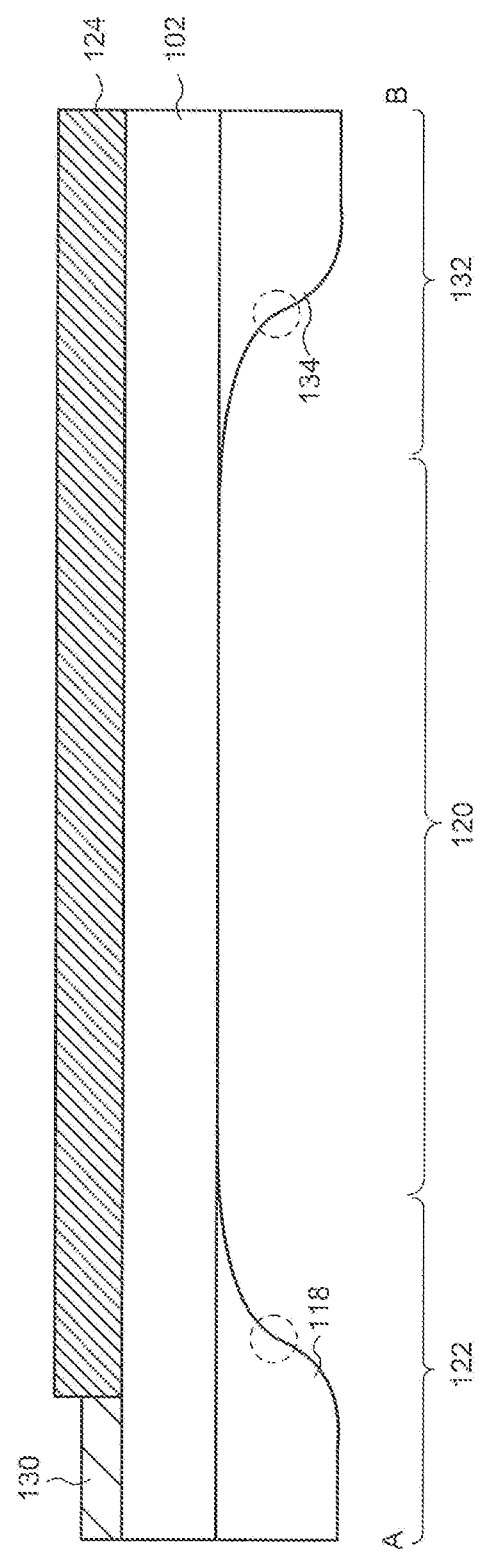
FIG. 7 is a schematic cross-sectional view of a display device according to an embodiment.

In the present embodiment, a display device according to an embodiment of the present invention is explained by using FIG. 7. Explanation of the structures which are the same as those of the First Embodiment may be omitted.

As shown in FIG. 7, the display device 200 of the present embodiment has the first substrate 118 and a second substrate 134 on a bottom surface of the base film 102. The first substrate 118 overlaps with the wiring layer 130. On the other hand, the second substrate 134 is formed at an opposite edge portion of the base film 102 with respect to the wiring layer 130 and overlaps with the element layer 124 including the display region 104. The base film 102 does not overlap with the first substrate 118 and the second substrate 134 and is exposed between the first substrate 118 and the second substrate 134. A region between the first substrate 118 and the second substrate 134 is a first region 120, a region in which the first substrate 118 overlaps with the base film 102 is a second region 122, and a region in which the second substrate 134 overlaps with the base film 102 is a third region 132. Note that, although the first substrate 118 overlaps with the element layer 124 in FIG. 7, the display device 200 of the present embodiment is not limited to this structure, and the first substrate 118 may not overlap with the element layer 124.

Here, similar to the First Embodiment, the thickness of the first substrate 118 decreases with decreasing distance to the first region 120. Furthermore, a thickness of the second substrate 134 decreases with decreasing distance to the first region 120. Namely, the first substrate 118 and the second substrate 134 have a taper shape. An edge portion of the taper shape is in contact with the base film 102. The surface of the first substrate 118 may be curved and may have an inflection point. Similarly, a surface of the second substrate 134 may be bent and may have an inflection point. In the example shown in FIG. 7, the first substrate 118 and the second substrate 134 each have one inflection point (the portion surrounded by a dotted ellipse).

Although not shown, the shapes of the first substrate 118 and the second substrate 134 of the display device 200 of the present embodiment are not limited thereto. The edge portion of the taper shapes may have a round shape or have a plane perpendicular to the surface of the base film 102 as shown in the First Embodiment. As described in the First Embodiment, the arrangement of the first substrate 118 and the second substrate 134 having such a shape facilitates the connection of the connector 116 and the IC chip and prevents the base film 102 from being peeled from the first substrate 118 and the second substrate 134. Furthermore, it is possible to prevent damage of the display device 200 even if the base film 102 contacts with the edge portions of the first substrate 118 and the second substrate 134. Accordingly, a manufacturing yield and reliability of a display device can be improved.

Third Embodiment

In the present embodiment, a display device according to an embodiment of the present invention is explained by using FIG. 8A and FIG. 8B. Explanation of the structures which are the same as those of the First and Second Embodiments may be omitted.

As shown in FIG. 8A, the display device 300 of the present embodiment has a substrate 118 under the base film 102 so as to overlap with the whole of or substantially the whole of the base film 102. The substrate 118 has a first region 120 having a constant thickness and a second region having a variable thickness and a constant thickness. Furthermore, the substrate 118 continues from the first region 120 to the second region 122 and overlaps with the whole of or substantially the whole of the base film 102. In the first region 120, the substrate 118 has a thickness which allows the display region 104 of the display device 300 to possess flexibility. As shown in FIG. 8A, the first region 120 overlaps with the element layer 124 and may further overlap with the wiring layer 130. Additionally, the second region 122 overlaps with the wiring layer 130 and may further overlap with the element layer 124.

As described above, the thickness of the substrate 118 is constant in the first region 120, and the substrate 118 has flexibility. The thickness of the substrate 118 in the first region 120 is equal to or larger than 10 μm and equal to or smaller than 300 μm, equal to or larger than 20 μm and equal to or smaller than 100 μm, or equal to or larger than 20 μm and equal to or smaller than 50 μm. Therefore, the display device 300 can be bent or folded so as to be deformed in the first region 120.

On the other hand, the portion with the variable thickness and the portion with the constant thickness are included in the second region 122. As shown in FIG. 8A, in the portion with the variable thickness, the thickness of the substrate 118 decreases with decreasing distance to the first region 120. That is, this portion has a taper shape, and an edge portion of the taper shape connects with the first region 120. In this portion, the surface of the substrate 118 may be curved or have an inflection. For example, the substrate 118 shown in FIG. 8A has one inflection (a portion surrounded by a dotted circle). Furthermore, the portion with the constant thickness in the second region 122 has a thickness and strength which inhibit deformation of the display device 300. A specific thickness is equal to or larger than 500 μm and equal to or smaller than 1200 μm or equal to or larger than 700 μm and equal to or smaller than 900 μm.

In the present embodiment, the shape of the substrate 118 is not limited to the aforementioned structure. For example, as shown in FIG. 8B, the substrate 118 may have a taper shape having a round edge portion in the second region 122. In this case, the round edge portion is not in contact with the base film 102. However, similar to the case of FIG. 8A, the substrate 118 continues from the first region 120 to the second region 122. Furthermore, although not shown, a side surface of the substrate 118 may have a plane perpendicular to the surface of the base film 102 in the second region 122, similar to the structure shown in FIG. 6A and FIG. 6B explained in the First Embodiment.

The arrangement of the substrate 118 having such a shape facilitates the connection of the connector 116 and the IC chip 114 and prevents damage of the display device 300 even if the deformation of the display device 300 causes the contact of the first region 120 with the second region 122. Accordingly, a manufacturing yield and reliability of a display device can be improved.

Fourth Embodiment

Figure 9:
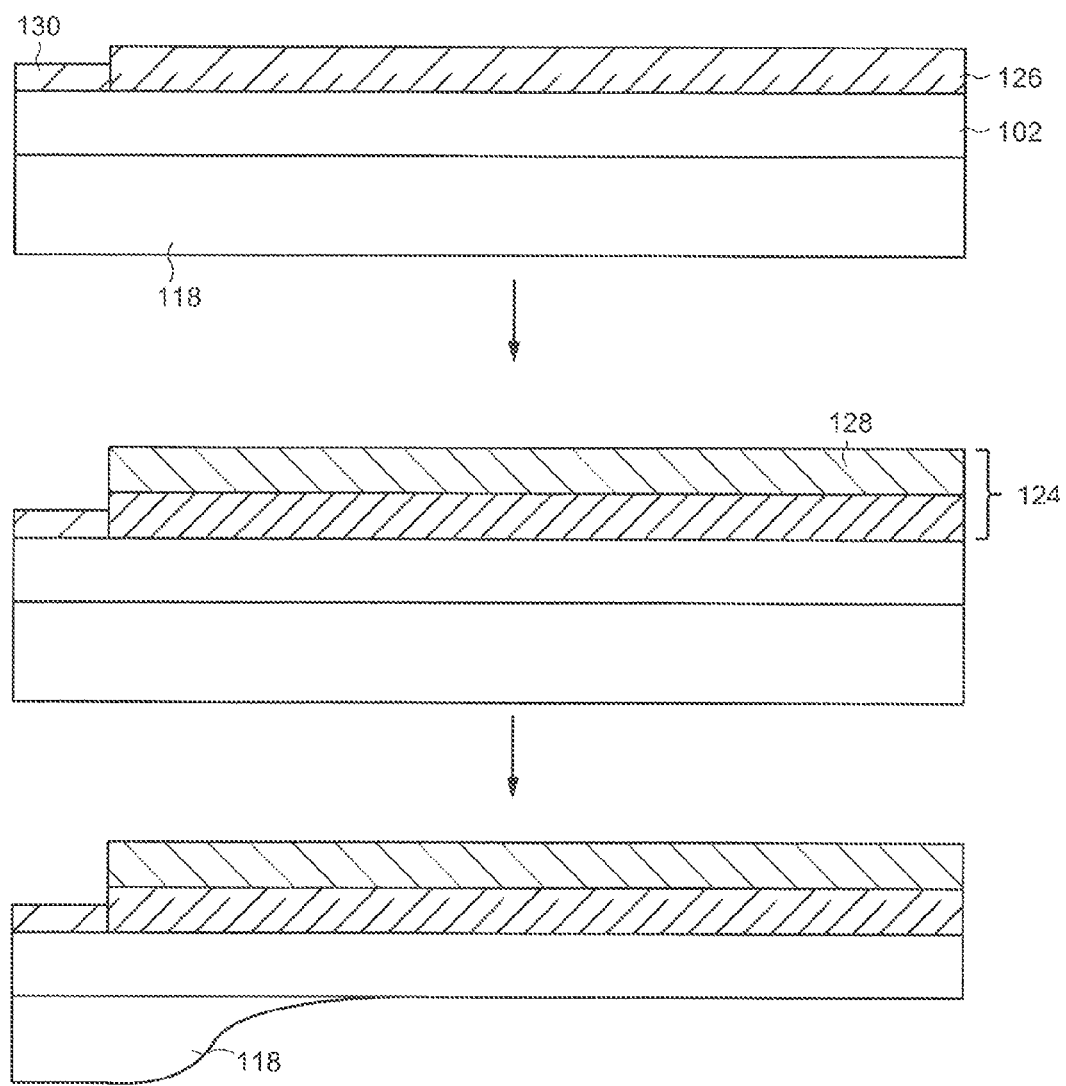
FIG. 9 is a schematic cross-sectional view of a display device according to an embodiment.
Figure 10:
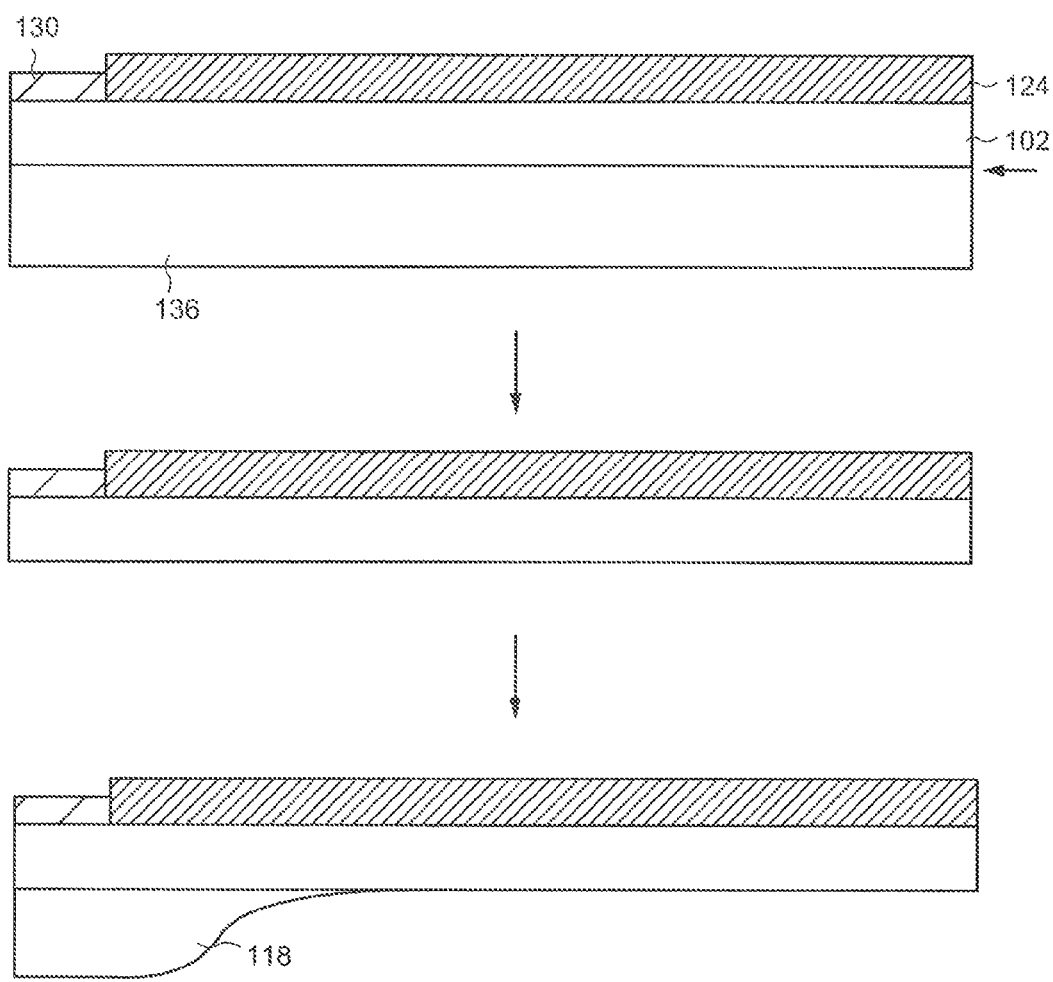
FIG. 10 is a schematic cross-sectional view of a display device according to an embodiment.

In the present embodiment, a manufacturing method of a display device according to an embodiment of the present invention is explained by using FIG. 9 and FIG. 10. Explanation of the structures which are the same as those of the First to Third Embodiments may be omitted.

As shown in FIG. 9, the base film 102 is formed over the substrate 118. At this time, the substrate 118 may not have the shape shown in the First to Third Embodiments, but may be a plane substrate having a substantially uniform thickness. For the substrate 118, glass and quartz can be used, for example. Alternatively, a resin such as an acrylic resin, a polycarbonate or a polyester can be used. The base film 102 has flexibility and can be formed by using a polyimide, a polyamide, a polycarbonate, and the like with a printing method, a spin-coating method, a lamination method, and the like.

The transistor layer 126 included in the element layer 124 is formed over the base film 102, and the wiring layer 130 is simultaneously formed. As described in the First Embodiment, the undercoat 212 formed under the transistor 210, the semiconductor film 214, the gate insulating film 216, and metal layers providing the gate 218, the source 222, and the drain 224, which form the transistor 210, are included in the transistor layer 126. The wiring 110 included in the wiring layer 130 is formed with the metals which form the gate 218, the source 222, or the drain 224.

The EL element layer 128 included in the element layer 124 is formed over the transistor layer 126. As described in the First Embodiment, the pair of electrodes 252 and 258, the organic layer 256, which form the light-emitting element 250, and the passivation film 260 for protecting the light-emitting element 250 are included in the EL element layer 128. One of the pair of electrodes 252 and 258 of the light-emitting element 250 is electrically connected to the transistor 210.

After that, the substrate 118 is heated with a method such as laser irradiation and processed into the shapes described in the First to Third Embodiments, by which the display devices 100, 200, and 300 are obtained. Other than the processing with the heating treatment, physical polishing may be performed on the substrate 118, for example.

Alternatively, as shown in FIG. 10, after sequentially forming the base film 102, the transistor layer 126 over the baser film 102, and the element layer 124 including the EL element layer 128 over the supporting substrate 136, the supporting substrate 136 is separated at an interface indicated by an arrow in the drawing. After that, the substrate 118 which is independently prepared and which has the shapes described in the First to Third Embodiments may be bonded to the base film 102. As the base substrate 136, a substrate including glass or quartz can be employed, and its shape may be a plane shape having a substantially uniform thickness. The substrate 118 is formed by processing a plane glass substrate with etching using fluoric acid and the like or by physically polishing a plane glass substrate, and then bonded to the base film 102. Alternatively, a substrate including a resin may be processed with laser irradiation or physical polishing into the shapes described in the First to Third Embodiments, and then bonded to the base film 102.

Fifth Embodiment

In the present embodiment, an embodiment in which the display devices 100, 200, and 300 shown in the First to Third Embodiments are deformed into a desired shape and used is described with reference to FIG. 11A to FIG. 13C. Explanation of the structures which are the same as those of the First to Fourth Embodiments may be omitted.

As shown in FIG. 11A, a display device 400 shown in the present embodiment has a structure similar to that of the display device 200 described in the Second Embodiment and possesses the base film 102 and the element layer 124 and the wiring layer 130 formed over the base film 102. The display device 400 has the first substrate 118 and the second substrate 134 at both edge portions. A region sandwiched between the first substrate 118 and the second substrate 134 is the first region 120, and regions in which the base film 102 overlaps with the first substrate 118 and the second substrate 134 are the second region 122 and the third region 132, respectively. The first substrate 118 and the second substrate 134 each have the shapes described in the First and Second Embodiments.

The display device 400 further has a first housing 140 enclosing the first substrate 118. The first housing 140 may also be provided so as to enclose the first substrate 118 and further enclose a part of the base film 102, a part of the wiring layer 130, and a part of the element layer 124 in the second region 122. Similarly, the display device 400 possesses a second housing 142 enclosing the second substrate 134. The second housing 142 may also be provided so as to enclose a part of the base film 102 and a part of the element layer 124 in the third region 132. Note that a part of the first substrate 118 may be exposed from the first housing 140. Similarly, a part of the second substrate 134 may be exposed from the second housing 142. Here, a portion of the element layer 124, which is exposed from the first housing 140 and the second housing 142, is a display surface 150, and an opposite side with respect to the base film 102 is a non-display surface 152.

A state in which the display device 400 is three-folded is shown in FIG. 11B. This state makes a part of the display surface 150 be located inside of the display device 400. Therefore, an area of the display surface 150 can be reduced compared with that of a state in which the display device 400 is spread as shown in FIG. 11A. Since the display operation is not necessary in the display surface 150 which is located inside of the display device 400, power consumption of the display device 400 can be decreased. Furthermore, the display device 400 itself takes a compact shape, which improves handling of the display device 400.

Moreover, the display device 400 can exist in a four-folded state shown in FIG. 11C, which realizes a more compact shape compared with the structure shown in FIG. 11B and further facilitates the handling of the display device 400. In this case, the display surface 150 exposes a part of a side surface of the display device 400, and most of the part of the display surface 150 is located inside of the four-folded display device 400. The exposed part of the display surface 150 can be subjected to display of only the information important for a user.

Therefore, when a user watches or reads images including a large amount of information, the user can spread and use the display device 400 so that the whole of the display surface 150 faces the user. On the other hand, when information of minimum necessity is necessary or when the display device 400 is carried, the display device 400 can be deformed into the more compact three- or four-folded state.

When the display device 400 is thus folded, the element layer 124 not only has a curved portion in which the EL element layer 128 is located more inside than the transistor layer 126 but also simultaneously possesses a curved portion in which the EL element layer 128 is located more outside than the transistor layer 126. As described in the First to Fourth Embodiments, it is possible to prevent the peeling of the base film 102 from the element layer 124 or damage of the display device 400 even if the display device 400 is deformed in this way because the first substrate 118 and the second substrate 134 have the taper shapes. Hence, a flexible display device which can be three- or four-folded and which has high reliability can be supplied.

As shown in FIG. 12A, the display device 400 may further possess a buffer substrate 144 which is positioned in the region between the first substrate 118 and the second substrate 134. The buffer substrate 144 can be arranged on the bottom surface of the base film 102, and can be further arranged so as to be closer to one of the first substrate 118 and the second substrate 134. For example, in FIG. 12A, the buffer substrate 144 is provided closer to the second substrate 134 than to the first substrate 118.

The buffer substrate 144 can include glass or a resin. Preferably, a material which is the same as that for the first substrate 118 and the second substrate 134 is included.

It is preferred that the buffer substrate 144 have a taper shape at edge portions which face the first substrate 118 and the second substrate 134 as shown in FIG. 12A. Specifically, the buffer substrate 144 has a first edge portion 146 which is closer to the first substrate 118 than to the second substrate 134 and a second edge portion which is closer to the second substrate 134 than to the first substrate 118. An edge portion of the taper shape of the first edge portion 146 is not in contact with the base film 102 and is spaced from the base film 102. On the other hand, it is preferred that an edge portion of the taper shape of the second edge portion 148 be in contact with the base film 102 as shown in FIG. 12A. A surface of the buffer substrate 144 may be curved and have an infection.

When the display device 400 is three-folded as shown in FIG. 12B, the display device 400 is bent at around the first terminal portion 146 (a site surrounded by a dotted circle in FIG. 12B) so that the transistor layer 126 is located more inside than the EL element layer 128. In this case, the aforementioned shape of the first edge portion 146 prevents damage of the base film 102. Furthermore, when the display device 400 is four-folded, the display device 400 is folded at around the second edge portion 148 (a site surrounded in a dotted circle in FIG. 12C) so that the EL element layer 128 is located more inside than the transistor layer 126. In this case, the second edge portion 148 of the buffer substrate 144 is bent along the bent portion of the base substrate 102 due to its small thickness, maintaining the contact with the base film 102. Hence, it is possible to prevent the base film from being peeled from the buffer substrate 144.

When the display device 400 is folded, the base film 102 is in contact with itself with the folded position therebetween. However, this contact can be prevented by the buffer substrate 144, by which abrasion and damage of the base film 102 can be prevented.

Sixth Embodiment

Figure 13A:
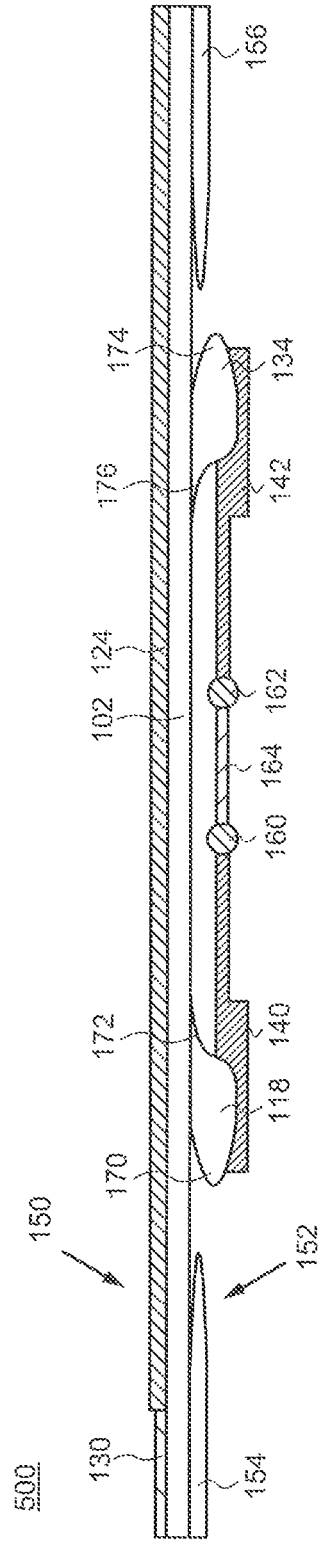
FIG. 13A to FIG. 13C are each a schematic cross-sectional view of a display device according to an embodiment.
Figure 13B:
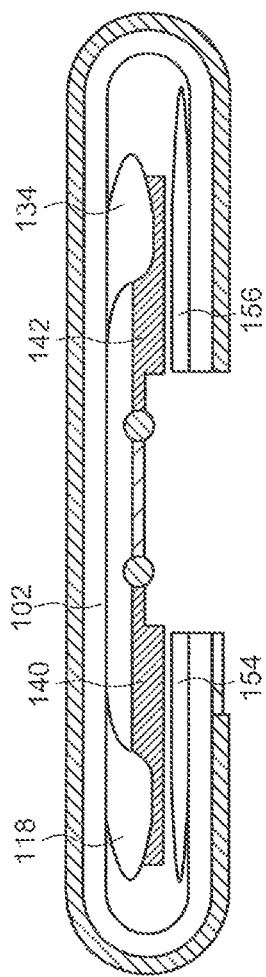
Figure 13C:
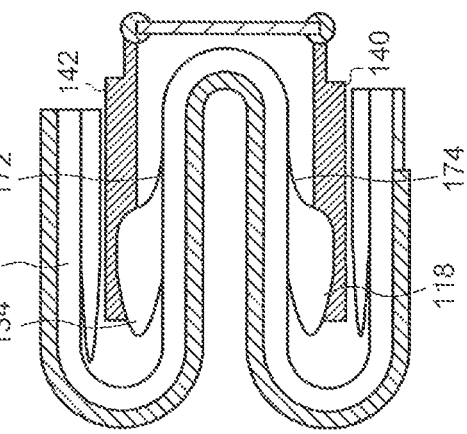

In this embodiment, a display device according to an embodiment of the present invention is explained by using FIG. 13A to FIG. 13C. Explanation of the structures which are the same as those of the First to Fifth Embodiments may be omitted.

The display device 500 of the present embodiment has the base film 102 and the element layer 124 which is formed over the base film 102 and which includes the transistor layer 126 and the EL element layer 128. The display device 500 further possesses the first substrate 118 and the second substrate 134 under the base film 102. The first substrate 118 and the second substrate 134 each overlap with a part of the base film 102, and the base film 102 is exposed between the first substrate 118 and the second substrate 134. A part of the bottom surface of the base film 102 is exposed in a region other than the region where the base film 102 overlaps with the first substrate 118 or the second substrate 134 and the region between the first substrate 118 and the second substrate 134. The first substrate 118 and the second substrate 134 each does not overlap with the wiring layer 130. The element layer 124 side of the display device 500 is the display surface 150, and its opposite surface is the non-display surface 152.

The display device 500 further has a first buffer substrate 154 and a second buffer substrate 156 under the base film 102. The first buffer substrate 154 is provided so that the first substrate 118 is sandwiched between the first buffer substrate 154 and the second substrate 134. The second buffer substrate 156 is formed so that the second substrate 134 is sandwiched between the second buffer substrate 156 and the first substrate 118. As shown in FIG. 13A, the first buffer substrate 154 may overlap with the wiring layer 130. The first substrate 118, the second substrate 134, the first buffer substrate 154, and the second buffer substrate 156 can be formed by using the materials described in the First and Fifth Embodiments.

The display device 500 further possesses the first housing 140 enclosing a part of the first substrate 118 and the second housing 142 enclosing a part of the second substrate 134. The first housing 140 and the second housing 142 are connected to a hinge 160 and a hinge 162, respectively, and can rotate about the hinge 160 and hinge 162 as rotation axes, respectively. The hinge 160 and the hinge 162 are connected to each other through a connector 164.

The first substrate 118 has a first edge portion 170 and a second edge portion 172 facing each other. Similarly, the second substrate 134 has a first edge portion 174 and a second edge portion 176 facing each other. The second edge portion 172 of the first substrate 118 and the second edge portion 176 of the second substrate 134 face each other. The first edge portion 170 and the second edge portion 172 of the first substrate 118 and the first edge portion 174 and the second edge portion 176 of the second substrate 134 each have a taper shape. The taper shape of the first edge portion 170 of the first substrate 118 and the taper shape of the first edge portion 174 of the second substrate 134 have a round edge portion which is not in contact with the base film 102. On the other hand, the taper shape of the second edge portion 172 of the first substrate 118 and the taper shape of the second edge portion 176 of the second substrate 134 are in contact with the base film 102. Furthermore, a surface of the second edge portion 172 of the first substrate 118 and a surface of the second edge portion 176 of the second substrate 134 may be curved and have an infection.

Each of an edge portion of the first buffer substrate 154 and an edge portion of the second buffer substrate 156, which face each other, also has a taper shape, and edge portions of the taper shapes are not in contact with the base film 102 and are spaced from the base film 102.

The display device 500 having such a structure can be folded at a region between the first buffer substrate 154 and the first substrate 118 and a region between the second buffer substrate 156 and the second substrate 134. In this case, the base film 102 and the first substrate 118 could contact with each other at around the folded portion as shown in FIG. 13B. However, the first edge portion 170 of the first substrate 118 has the taper shape, and the edge portion of the taper shape has a round shape. Therefore, even if the base film 102 contacts with the first substrate 118, damage of the base film 102 can be prevented. Furthermore, there is also a possibility that the edge portion of the first buffer substrate 154 contacts with the base film 102. However, the damage of the base film 102 can be prevented because the edge portion of the buffer substrate 154 also has a round shape. The same is applied to the region between the second buffer substrate 156 and the second substrate 134. Hence, even if the display device 500 is folded at two regions as shown in FIG. 13B, the display device 500 is not damaged, and a display device having high reliability can be constructed.

When the display device 500 is folded so that the base film 102 approaches the first housing 140 and the second housing 142 as shown in FIG. 13B, the first buffer substrate 154 and the second buffer substrate 156 prevent their contact, by which damage of the base film 102 can be prevented.

The display device 500 can be further folded by using the hinge 160 and the hinge 162 as axes so as to be deformed into a four-folded state as shown in FIG. 13C. In this case, the display device 500 is folded so that the EL element layer 128 is located more inside than the transistor layer 126 in the region between the first substrate 118 and the second substrate 134. As described in the First Embodiment, the second edge portions 172 and 174 of the first substrate 118 and the second substrate 134, which are located at around the folded region, have the taper shapes, and the edge portions of the taper shapes are in contact with the base film 102. Therefore, as described in the First Embodiment, the second edge portion 172 of the first substrate 118 and the second edge portion 176 of the second substrate 134 are bent along the bent portion due to their small thickness, maintaining the contact with the base film 102. Hence, it is possible to prevent the peeling of the first substrate 118 and the second substrate 134 from the base film 102.

Accordingly, damage of the base film 102 of the display device 500 having the aforementioned structure can be prevented even if the display device 500 is deformed into the spread state (FIG. 13A), the partly spread state (FIG. 13B), and the four-folded state (FIG. 13C). That is, the structure of the present embodiment is able to supply a display device having high reliability.

Note that the display device 500 has two hinges 160 and 162, which allows the whole of the display surface 150 to possess a plane shape even in the spread state (FIG. 13A) and the partly spread state (FIG. 13B). However, the structure of the display device 500 is not limited thereto, and the display device 500 may have one hinge.

The aforementioned modes described as the embodiments of the present invention can be implemented by appropriately combining with each other as long as no contradiction is caused. Furthermore, any mode which is realized by the persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:

1. A display device comprising:
    a first region including:
        a base film;
        a first layer over the base film, the first layer comprising a transistor; and
        a second layer over the first layer, the second layer comprising a light-emitting element electrically connected to the transistor; and
    a second region adjacent to the first region, the second region including:
        the base film;
        a substrate located on an opposite side of the base film with respect to the first layer; and
        a wiring layer over the base film, the wiring layer comprising a wiring extending from the first layer to an edge portion of the base film,
    wherein a thickness of the substrate decreases with decreasing distance to the first region.

2. The display device according to claim 1,
    wherein the base film comprises a plurality of sides, and
    wherein the second region is located along one of the plurality of sides.

3. The display device according to claim 1,
    wherein a bottom surface of the base film is exposed in the first region.

4. The display device according to claim 1,
    wherein the substrate has a taper shape, and
    wherein an edge portion of the taper shape is in contact with the base film.

5. The display device according to claim 1,
    wherein the substrate has a taper shape having a round edge portion.

6. The display device according to claim 1,
    wherein the substrate has a taper shape, and
    wherein an edge portion of the taper shape has a plane perpendicular to a surface of the base film.

7. The display device according to claim 1,
    wherein the substrate includes glass or a resin.

8. The display device according to claim 1, further comprising a third region,
    wherein:
    the first region is located between the second region and the third region;
    the third region comprises:
        the base film;
        the first layer over the base film;
        the second layer over the first layer; and
        a second substrate located on an opposite side of the base film with respect to the first layer; and
    a thickness of the second substrate decreases with decreasing distance to the first region.

9. The display device according to claim 8,
    wherein the second substrate has a taper shape, and
    wherein an edge portion of the taper shape of the second substrate is in contact with the base film.

10. The display device according to claim 8,
    wherein the second substrate has a taper shape having a round edge portion.

11. The display device according to claim 8,
    wherein the second substrate has a taper shape, and
    wherein an edge portion of the taper shape of the second substrate has a plane perpendicular to a surface of the base film.

12. The display device according to claim 8, further comprising a housing covering the substrate and the second substrate.

13. The display device according to claim 8,
    wherein:
    the base film has flexibility;
    the display device has a four-folded shape; and
    the substrate overlaps with the second substrate with the first region interposed therebetween.

14. The display device according to claim 13, comprising:
    a buffer substrate under the base film in the first region,
    wherein, in the four-folded shape, the buffer substrate is surrounded by the base film.

15. The display device according to claim 14,
    wherein the buffer substrate has a taper shape, and
    wherein a thickness of the buffer substrate decreases with decreasing distance to the substrate.

16. The display device according to claim 14,
    wherein the buffer substrate has a taper shape, and
    wherein a thickness of the buffer substrate decreases with decreasing distance to the second substrate.

17. A display device comprising:
    a first region comprising:
        a base film;
        a first layer over the base film, the first layer comprising a transistor; and
        a second layer over the first layer, the second layer comprising a light-emitting element electrically connected to the transistor; and
    a second region adjacent to the first region, the second region including:
        the base film; and
        a wiring layer over the base film, the wiring layer comprising a wiring extending from the first layer to an edge portion of the base film,
    wherein a substrate is located on an opposite side of the base film with respect to the first layer and continues from the first region to the second region, wherein a thickness of the substrate is constant in the first region, and wherein, in the second region, a thickness of the substrate decreases with decreasing distance to the first region.

18. The display device according to claim 17, wherein the base film comprises a plurality of sides, and wherein the second region includes at least a part of an edge portion of the base film and is located along one of the plurality of sides.

19. The display device according to claim 17, wherein the substrate has a taper shape having a round edge portion.

20. The display device according to claim 17, wherein the substrate has a taper shape, and wherein an edge portion of the taper shape has a plane perpendicular to a surface of the base film.

* * * * *